US012771352B2

(12) United States Patent
Bobda et al.

(10) Patent No.: US 12,771,352 B2
(45) Date of Patent: Oct. 20, 2026

(54) CMOS GALVANIC ISOLATION FOR PREVENTING REMOTE PHYSICAL ATTACKS IN MULTI-TENANT CLOUD FPGA SYSTEMS

(71) Applicant: University of Florida Research Foundation, Incorporated, Gainesville, FL (US)

(72) Inventors: Christophe Bobda, Gainesville, FL (US); Muhammed Kawser Ahmed, Gainesville, FL (US)

(73) Assignee: University of Florida Research Foundation, Incorporated, Gainesville, FL (US)

( * ) Notice: Subject to any disclaimer, the term of this patent is extended or adjusted under 35 U.S.C. 154(b) by 0 days.

(21) Appl. No.: 19/173,079

(22) Filed: Apr. 8, 2025

(65) Prior Publication Data

US 2025/0330179 A1 Oct. 23, 2025

Related U.S. Application Data

(60) Provisional application No. 63/635,752, filed on Apr. 18, 2024.

(51) Int. Cl.
*H03K 19/177* (2020.01)
*H03K 17/687* (2006.01)

(52) U.S. Cl.
CPC ....... *H03K 19/177* (2013.01); *H03K 17/6872* (2013.01)

(58) Field of Classification Search
CPC ......................... H03K 19/177; H03K 17/6872
See application file for complete search history.

(56) References Cited

U.S. PATENT DOCUMENTS

| | | | | |
|---|---|---|---|---|
| 7,376,037 | B1 * | 5/2008 | Law | G11C 5/144 365/229 |
| 8,159,263 | B1 * | 4/2012 | Tuan | H03K 19/0016 326/38 |
| 8,502,558 | B1 * | 8/2013 | Rahim | H03K 19/17784 326/38 |
| 11,799,480 | B1 * | 10/2023 | Adlakha | H03K 19/018521 |
| 2017/0126005 | A1 * | 5/2017 | Elsayed | G06F 1/26 |
| 2020/0228388 | A1 * | 7/2020 | Schulz | H04L 67/00 |
| 2020/0387205 | A1 * | 12/2020 | Zyuban | H03K 17/223 |
| 2022/0116041 | A1 * | 4/2022 | Kumashikar | G06F 1/3287 |
| 2023/0336179 | A1 * | 10/2023 | Serra | H03K 19/17784 |
| 2026/0080959 | A1 * | 3/2026 | Gupta | G11C 17/16 |
| 2026/0099634 | A1 * | 4/2026 | Srinivasan | G06F 21/76 |

* cited by examiner

*Primary Examiner* — Seokjin Kim
(74) *Attorney, Agent, or Firm* — Alston & Bird LLP

(57) ABSTRACT

A system comprising one or more tenant logic blocks that comprise one or more sharable portions of a field-programmable gate array hardware unit; a multiplexed voltage source comprising a multiplexer that is configured to provide the one or more tenant logic blocks with a power source based on one or more control signals, wherein the power source switches between (i) a complementary metal-oxide semiconductor (CMOS) voltage source and ground and (ii) a board voltage source and ground; and a configuration memory that is configured to provide the one or more control signals to the multiplexed voltage source.

20 Claims, 9 Drawing Sheets

CMOS GALVANIC ISOLATION FOR PREVENTING REMOTE PHYSICAL ATTACKS IN MULTI-TENANT CLOUD FPGA SYSTEMS

CROSS REFERENCE TO RELATED APPLICATION

This application claims the priority of U.S. Provisional Application No. 63/635,752, entitled "CMOS GALVANIC ISOLATION FOR PREVENTING REMOTE PHYSICAL ATTACKS IN MULTI-TENANT CLOUD FPGA SYSTEMS," filed on Apr. 18, 2024, the disclosure of which is hereby incorporated by reference in its entirety.

GOVERNMENT SUPPORT

This invention was made with government support under 2007320 awarded by The National Science Foundation. The government has certain rights in the invention.

TECHNICAL FIELD

Various embodiments of the present disclosure relate to hardware security, and more particularly to securing multi-tenant cloud field-programmable gate array (FPGA) systems.

BACKGROUND

Field-programmable gate arrays (FPGAs) may be offered by public cloud providers as cloud computing resources, such as FPGA-as-a-Service (FaaS) and acceleration-as-a-service (AaaS). FPGAs may offer unique advantages over traditional central processing units (CPUs) and graphics processing units (GPUs) in terms of computation and flexibility. Despite facilitating customized hardware acceleration, the usage of FPGAs in cloud applications may introduce security challenges. For example, cloud users may be allowed to reconfigure hardware designs after deployment, which may create potential vulnerabilities that are exploitable by malicious users, thereby jeopardizing entire cloud platforms. Furthermore, as FPGA designs often underutilize an entirety of programmable logic available on a board, a single FPGA fabric may be shared among multiple cloud users. As such multi-tenant cloud FPGA services, where a single FPGA is divided spatially among multiple users, may be highly vulnerable to attacks, such as remote power side channel attacks, denial of service (DoS) attacks, and fault injection attacks.

Applicant has identified many technical challenges and difficulties associated with securing multi-tenant cloud FPGA systems.

BRIEF SUMMARY

Various embodiments described herein relate to methods, apparatus, systems, computing devices, computing entities, and/or the like for prevent remote physical attacks in multi-tenant cloud field-programmable gate array (FPGA) systems.

According to some embodiments, a system comprises one or more tenant logic blocks that comprise one or more sharable portions of a field-programmable gate array hardware unit; a multiplexed voltage source comprising a multiplexer that is configured to provide the one or more tenant logic blocks with a power source based on one or more control signals, wherein the power source switches between (i) a complementary metal-oxide semiconductor (CMOS) voltage source and ground and (ii) a board voltage source and ground; and a configuration memory that is configured to provide the one or more control signals to the multiplexed voltage source.

In some embodiments, the multiplexed voltage source is configured to galvanically isolate the one or more tenant logic blocks via the CMOS voltage source.

According to some embodiments, a galvanic isolation circuit comprises one or more tenant cores; a power management unit that is configured to select between an isolated power source or a board power source; a capacitor bank that is configured to isolate the one or more tenant cores by delivering one or more currents based on a power source selected by the power management unit; and a configuration controller unit that is configured to provide configuration data for managing selection of the power source.

In some embodiments, the capacitor bank comprises a reconfigurable capacitor bank. In some embodiments, the capacitor bank is configured to galvanically isolate the one or more tenant cores. In some embodiments, the capacitor bank comprises one or more charge pump isolation circuits that comprise one or more metal-over-metal capacitors. In some embodiments, a charge pump isolation circuit of the one or more charge pump isolation circuits comprises a tenant load that (i) connects to a first capacitor based on a first set of switches in an up position and a second set of switches in a down position and (ii) connects to a second capacitor based on the second set of switches in the up position and the first set of switches in the down position. In some embodiments, the first capacitor discharges and the second capacitor charges based on the first set of switches in the up position and the second set of switches in the down position. In some embodiments, the first capacitor charges and the second capacitor discharges based on the second set of switches in the up position and the first set of switches in the down position. In some embodiments, the configuration controller unit comprises a configuration memory that is configurable to selectively interconnect or isolate the one or more tenant cores. In some embodiments, the configuration memory comprises a section of a field-programmable gate array (FPGA) memory that comprises configuration data. In some embodiments, the configuration data comprises one or more interconnection or isolation policies that are associated with forming distinct regions within a FPGA.

According to some embodiments, an isolated tenant logic block system comprises an isolated power source; a complementary metal-oxide semiconductor (CMOS) that is coupled to the isolated power source; a plurality of tenant logic blocks that are configured to receive the isolated power source from the CMOS; and a multiplexer that is configured to modulate the isolated power source received by the plurality of tenant logic blocks from the CMOS.

In some embodiments, the plurality of tenant logic blocks comprises a field-programmable gate array (FPGA) device that comprises a two-dimensional array of a plurality of configurable logic block tiles that are coupled via a programmable routing network. In some embodiments, the plurality of tenant logic blocks comprises a programmable routing network, wherein the programmable routing network comprises a plurality of voltage routing switch blocks. In some embodiments, the plurality of tenant logic blocks comprises a configurable logic block cluster that is coupled to one or more connection blocks and one or more switch blocks. In some embodiments, the isolated power source comprises a galvanically isolated power source. In some embodiments, the isolated power source comprises a capacitive isolated power source. In some embodiments, the multiplexer is configured to provide voltage from the isolated power source based on an isolation control signal. In some embodiments, the multiplexer is configured to drive the CMOS from a board power source based on a board power source control signal.

BRIEF DESCRIPTION OF THE DRAWINGS

Embodiments incorporating teachings of the present disclosure are shown and described with respect to the figures presented herein.

DETAILED DESCRIPTION

Figure 1:
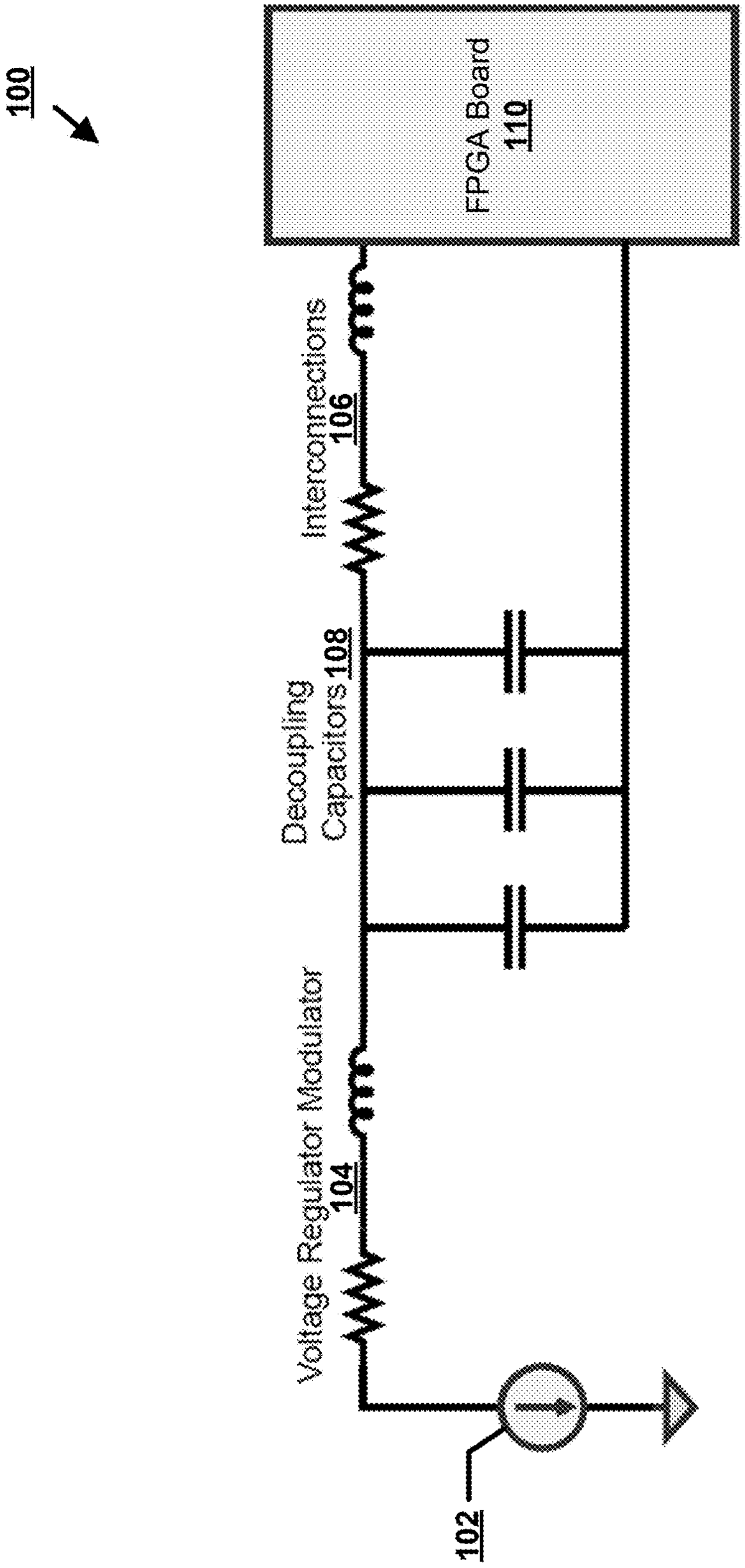
FIG. 1 depicts a circuit diagram of an example power distribution network (PDN).

Various embodiments of the present disclosure now will be described more fully hereinafter with reference to the accompanying drawings, in which some, but not all embodiments of the disclosure are shown. Indeed, the disclosure may be embodied in many different forms and should not be construed as limited to the embodiments set forth herein. Rather, these embodiments are provided so that this disclosure will satisfy applicable legal requirements. The term "or" is used herein in both the alternative and conjunctive sense, unless otherwise indicated. The terms "illustrative," "example," and "exemplary" are used to be examples with no indication of quality level. Like numbers refer to like elements throughout.

General Overview and Example Technical Improvements

The present disclosure provides physical isolation hardware for resisting remote physical attacks (e.g., power side channel, fault injections, and denial-of-service) with physical complementary metal-oxide semiconductor (CMOS)-based galvanic isolation.

As described above, sharing a single field-programmable gate array (FPGA) among different cloud tenants may introduce potential vulnerabilities, leading to remote physical attacks. That is, a plurality of tenants may share a same FPGA fabric and its power distribution network (PDN). As such, malicious attackers with access to the FPGA fabric may extract sensitive information, such as voltage and total current consumption. Accordingly, by exploiting such a vulnerability, attackers may remotely monitor voltage fluctuations in FPGA boards. Additionally, utilizing a shared PDN network allows for various hardware-based attacks, including remote FPGA power side-channel attacks, denial-of-service (DoS) attacks, remote fault-injection attacks, and covert channel communications.

To address these security concerns in multi-tenant cloud platforms, public cloud FPGA providers (CFPs) may implement design rule checks on tenant designs. Such design rule checks aim to detect suspicious combinational logic blocks that may potentially launch remote side-channel attacks and fault injection attacks. From the tenant's perspective, traditional hiding and masking techniques may be implemented in tenant designs, exponentially increasing attackers' efforts to leak sensitive information. Such traditional hiding and masking techniques may focus on generating noise signals by integrating a ring oscillator-based fence around cores, reducing overall signal-to-noise (SNR) ratio at an electrical level. Traditional logical isolation and access control methods to prevent unauthorized authentication and illegal software access are unable to prevent remote physical attacks from neighboring tenants. Moreover, traditional defense techniques against attacks, when implemented by tenants, may not pass a public CFP's design rule checks, as both attack and defense circuits use combinational-based logic loops on FPGA. Accordingly, defending against remote side-channel attacks, fault injections, and DoS attacks with a single solution may be challenging, given the diverse mechanisms of such attacks.

According to various embodiments of the present disclosure, a power distribution network for cloud FPGA security is provided by using physical CMOS-based galvanic isolation. Embodiments of the present disclosure may extend existing FPGA architectures with the addition of physical isolation to protect tenants' circuits on a same FPGA at various levels of granularity. In some embodiments, each tenant is isolated spatially to provide protection against voltage spikes, ground loops, and electrical noise, which may be associated with characteristics of remote physical attacks. By leveraging physical isolation, attacks may be successfully prevented, and a line of defense may be provided for cloud FPGA security.

In some embodiments, CMOS-based galvanic isolation is provided by using reconfigurable metal-over-metal (MoM) capacitors and switch banks, along with a power management and configuration controller unit. Furthermore, by implementing a custom configuration memory (CCM), a dynamic and customizable solution may be provided that allows FPGA designers to selectively interconnect or isolate groups of configurable logic blocks (CLBs). As such, distinct regions within a FPGA may be formed, each capable of sourcing power either from a dedicated CMOS isolation power supply or a standard FPGA voltage power supply, thereby isolating individual tenants to safeguard against voltage spikes, ground loops, and electrical noise (i.e., features of remote power side-channel attacks).

Example System Architecture

FPGA boards may be deployed in cloud computing environments according to various methods. For example, FPGAs may be deployed to act as co-processors alongside CPUs in a same data center node, accessible via peripheral component interconnect express (PCIe) cards. In another example, system-on-chip (SoC) FPGA devices may merge microprocessors and FPGA fabric on a single board, creating an integrated computing solution. In yet another example, a bump-in-the-wire approach may comprise situating FPGAs between a network interface card (NIC) and a broader network infrastructure, where the FPGAs may serve as intermediaries for data processing and management within a server.

Cloud computing hardware and/or resources, such as cloud-based FPGAs may be shared among multiple tenants through two sharing models: time and spatial. In a time-sharing scheme, an entire FPGA board may be allocated to a user/tenant for a specific time period, during which the tenant has full control and access. In spatial sharing, a FPGA fabric may be partitioned into different regions, granting concurrent tenants access to isolated regions for designated time periods. Spatial sharing may offer several advantages, including optimal resource utilization, shorter wait times, and potential cost savings. Users may be billed based on the specific segments they utilize, making cloud-based FPGA utilization more efficient and cost-effective.

FIG. 1 depicts a circuit diagram of an example PDN 100. In FPGA technology, a single power distribution network (PDN) may be responsible for supplying and maintaining necessary voltage level and current for all components in a board. As depicted in FIG. 1, PDN 100 comprises a power source 102, a voltage regulator modulator 104, interconnections 106 (e.g., power planes or metal layers), and decoupling capacitors 108. While power source 102 may provide a firm voltage to the PDN 100, decoupling capacitors 108 may be integrated between the power source 102 and a ground plane in order to reduce noise and voltage drop which creates a low impedance path. As such, a small variation in the PDN 100 network may cause a significant current drop and hence affect the voltage. By inserting a sensor, voltage drops may be read and exploited to launch attacks. With varying current demand, the PDN 100 may try to maintain a steady voltage throughout the FPGA board 110. However, high switching activities caused by a tenant's design may introduce an observable drop that exposes the power consumption of the entire board.

In a CMOS circuit, overall power usage may be obtained by adding together static power (which may remain relatively constant during operation), and dynamic power consumed by individual components. Remote power side channel attacks may specifically focus on dynamic power consumption, as static power remains relatively steady during operation. An equation for determining dynamic power consumption in a CMOS circuit may be obtained by $Pd_{dynamic}$, which may comprise a sum of charging power and total short-circuit power consumption, $P_{dynamic}=P_{charging}+P_{short\text{-}circuit}$. Where $$P_{charging} = \alpha * f * C_L * V_{DD}^2$$

and $P_{short\text{-}circuit}=\alpha*f*V_{DD}*I_{peak}*t_{sc}$, where a may refer to the term activity factor of the circuit, $V_{DD}$ may represent a supply voltage to the board, $C_L$ may represent capacitance of a load, $I_{peak}$ may represent a highest peak current delivered to a network, and $t_{sc}$ may represent a time required for flowing a short circuit current. The dynamic power proportionally increases with factor α.

An RC-based equivalent network may be representative an on-chip PDN circuitry of a FPGA. For example, an internal voltage regulator may manage the adjustment of a board's voltage level to align with a die's voltage level. The inclusion of decoupling and parallel capacitors may aid in the elimination of undesired voltage fluctuations. The following equation may describe a voltage decline across a PDN circuitry:

$$V_{drop}(s) = I(s)Z_{PDN}(s) \qquad \text{Equation 1}$$

where $Z_{PDN}(s)$ may represent a total impedance of the PDN block in the frequency domain. Equation 1 may also be expressed as $$V_{drop}(s) = IR + L\frac{dt}{dt}.$$

In a steady-state condition, the resistive component of ZPDN(s) may be equal to IR, which is responsible for a steady state drop (transient drop). However, a well-designed malicious circuit has the potential to significantly amplify the steady state/transient drop, which may cause a substantial voltage drop due to increased current draw. In the context of CMOS circuits, an inverse relationship may exist between delay of combinational circuits and voltage drop. Such an inverse relationship may be harnessed to extract the power consumption of a CMOS circuit by crafting combinational logic delay circuits. For example, an attacker can employ a circuit incorporating combinational delays to exploit and gain insight into the power consumption of the FPGA board.

Figure 2:
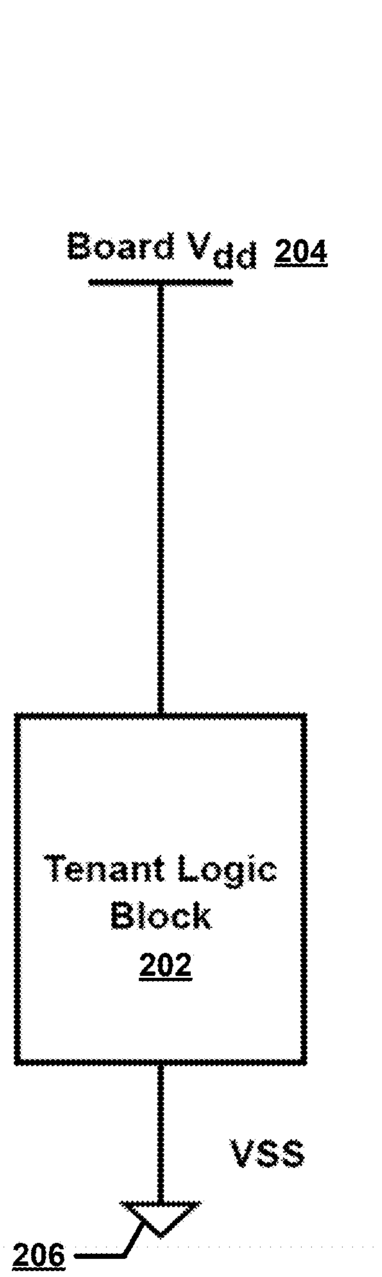
FIG. 2 depicts a block diagram of an example multi-tenant cloud field-programmable gate array (FPGA) architecture.

FIG. 2 depicts a block diagram of an example multi-tenant cloud FPGA architecture 200. As discussed herewith, a single PDN may be capable of delivering power to all of a FPGA board's components. The multi-tenant cloud FPGA architecture 200 comprises a PDN configuration where an entirety of a FPGA board comprising a plurality of tenant logic blocks that shares and/or is coupled to board power supply (Vdd) 204 and ground 206 of FPGA metal layers. Accordingly, the tenant logic block 202 comprises a partition of one or more sharable portions of a FPGA board that is coupled to the Vdd 204 and the ground 206 along with one or more other tenant logic blocks of a plurality of tenant logic blocks of the FPGA board. Thus, the multi-tenant cloud FPGA architecture 200 may be vulnerable to remote side channel and fault injection attacks when used in a multi-tenant cloud FPGA system where a plurality of tenants may share or have access to tenant logic blocks that co-exist on a single FPGA board.

For example, in multi-tenant cloud FPGA attacks, an attacker may not have access to a target hardware (e.g., tenant logic block 202) to probe voltage or electromagnetic waves like in traditional side channel attacks, such as simple power analysis or differential power analysis. Instead, the attacker may have access to a single, shared PDN (e.g., Vdd 204 and ground 206) of a FPGA board. As such, an attacker may draw current over the PDN and analyze voltage fluctuations. Hence, the attacker may exploit power consumption information and launch remote physical attacks, such as in remote power side channel attacks, remote fault injection attacks, or cross talk communication.

Furthermore, remote power side channel attacks may be carried out by either using a ring oscillator (RO) or a time-to-digital converter (TDC)-based delay sensor design which may sense PDN variation events and sufficiently exploit voltage drop fluctuations to extract sensitive information of the FPGA board. Accordingly, multi-tenant cloud FPGAs are prone to remote power side channel attacks as such sensing devices may be readily configured or designed to report power consumption report of a FPGA board. Thus, by exploiting a PDN network of a FPGA fabric, a malicious attacker may cause excessive voltage drop, which may affect board functionality. For example, an attacker may simultaneously cause voltage drop at high switching speed over a period of time leading to significant timing violations and logic delays. At critical voltage levels, a voltage drop may also force a FPGA board to crash when the FPGA board stops operating due to low power supply.

To mitigate the aforementioned problems, various embodiments of the present disclosure provide CMOS-based galvanically isolated power delivery hardware that is configured to isolate the power supply of each tenant in a FPGA device.

Figure 3:
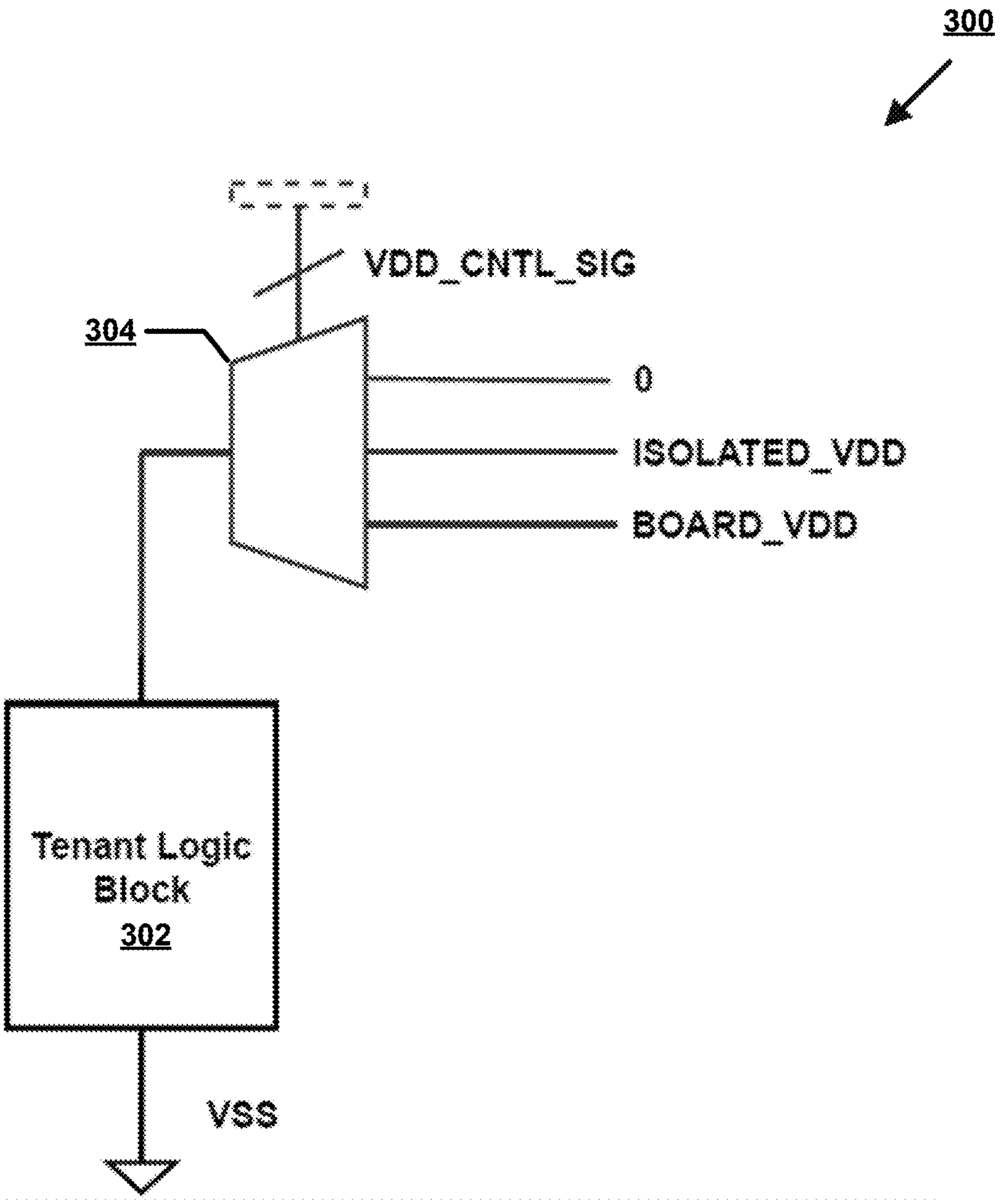
FIG. 3 depicts a block diagram of an example isolated multi-tenant cloud FPGA architecture in accordance with some embodiments of the present disclosure.

FIG. 3 depicts a block diagram of an example isolated multi-tenant cloud FPGA architecture 300 in accordance with some embodiments of the present disclosure. As depicted in FIG. 3, isolated multi-tenant cloud FPGA architecture 300 comprises one or more tenant logic block 302 that is coupled to a multiplexed voltage source 304. The tenant logic block 302 may comprise one or more sharable portions of a FPGA hardware unit. The multiplexed voltage source 304 may comprise a multiplexer that is configured to spatially (e.g., galvanically) isolate the tenant logic block 302 by providing the tenant logic block 302 with either (i) a physically separated CMOS voltage source (e.g., associated with an ISOLATED_VDD signal) and ground, or (ii) a board voltage source (e.g., associated with a BOARD_VDD signal) and ground that is provided through multiplexed voltage source 304. Control of isolation of the tenant logic block 302, using multiplexed voltage source 304, may be managed by control signals (e.g., VDD_CNTL_SIG) that are provided from a custom configuration memory.

Example System Operations

In some embodiments, galvanic isolation comprises a technique that is used to separate electrical circuits from each other in a manner that prevents a flow of direct current (DC) between the electrical circuits. Galvanic isolation may rely on the use of a physical barrier or an isolation device, such as transformers or optocouplers, to transmit signals or power across an isolation boundary. The isolation boundary may provide protection against electrical noise, voltage spikes, and ground loops that can occur in interconnected systems.

In some embodiments, CMOS capacitive isolation is implemented to provide galvanic isolation between circuits by using capacitors to transfer signals or power while maintaining isolation between the input and output sides. By integrating capacitors strategically within the CMOS structure, modules can communicate effectively while being electrically isolated, preventing issues such as ground loops and voltage differences. Examples of CMOS capacitive isolation include, but are not limited to, metal-insulator-metal (MIM) capacitors, interdigitated capacitors, and gate oxide isolation, each with unique characteristics and applications. MIM capacitors may comprise capacitors where the insulator layer provides electrical isolation. MIM capacitors may be integrated into a CMOS structure, offering a compact solution for achieving isolation. Interdigitated capacitors may employ capacitors where capacitor plates are interleaved to provide enhanced capacitance and allows for effective isolation, making such a configuration suitable for applications that may benefit from higher isolation levels. Gate oxide isolation may exploit the gate oxide layer in CMOS transistors to achieve capacitive isolation. By configuring the transistor structure, the gate oxide can function as a capacitor, providing isolation between circuits.

In FPGA-based designs, the incorporation of galvanic isolation may provide a protective measure that shields FPGA and other sensitive components from potential issues, such as voltage differences, ground loops, and electrical noise that may be caused by various power supplies, sensors, or external interfaces. As such, galvanic isolation may act as a barrier against unwanted flow of DC between circuits, thereby preventing disruptions and enhancing overall reliability of a FPGA system. Galvanic isolation as described herein may be particularly beneficial in scenarios where maintaining the integrity of signals and the stability of a system is desired.

Figure 4:
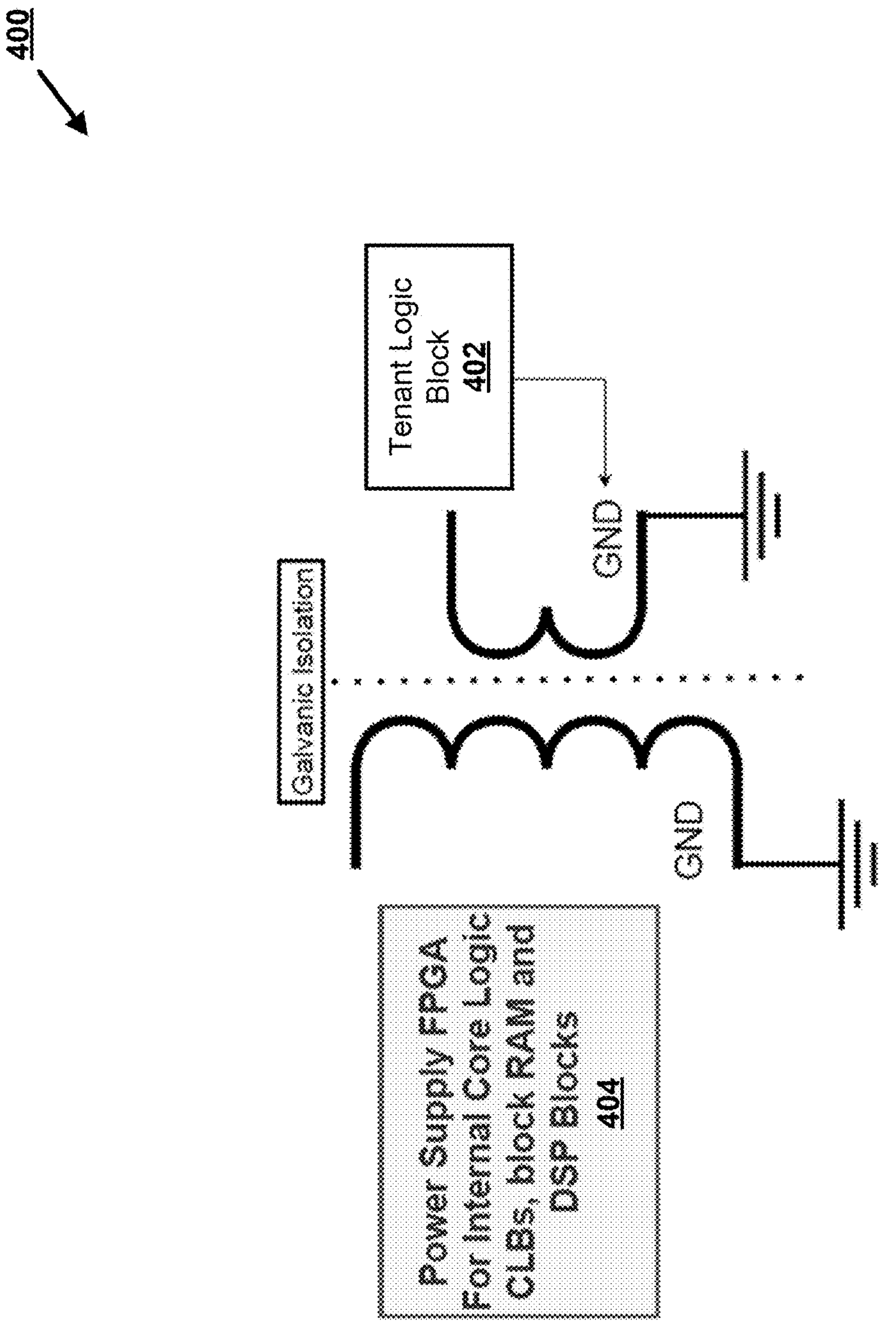
FIG. 4 depicts a schematic of an example galvanically coupled isolation circuit in accordance with some embodiments of the present disclosure.

FIG. 4 depicts a schematic of an example galvanically coupled isolation circuit 400 in accordance with some embodiments of the present disclosure. By galvanically isolating the power supply 404 of a tenant logic block 402, the tenant logic block 402 may be protected from voltage drops or currents present in neighboring tenant logic blocks. According to various embodiments of the present disclosure, the galvanically coupled isolation circuit 400 may implement capacitor-based galvanic isolation by using reconfigurable MoM capacitors and switch banks along with a power management and configuration controller unit. MoM capacitors may act as an energy reservoir, and by utilizing suitable switching mechanisms, attached power supplies may be isolated and separated from a main voltage supply while still delivering necessary current to the tenant logic block 402.

Figure 5:
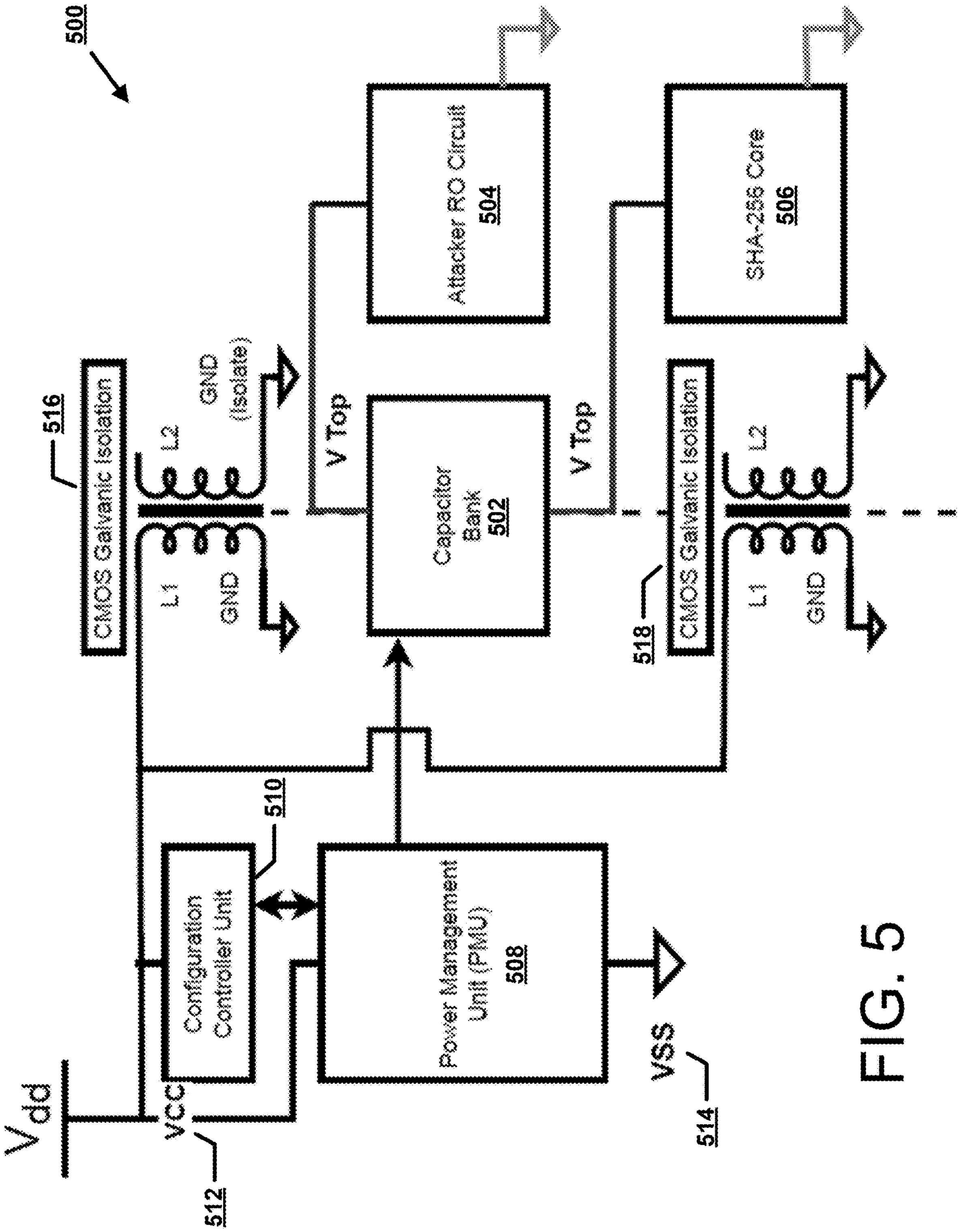
FIG. 5 depicts a schematic diagram of a capacitive galvanic isolation circuit in accordance with some embodiments of the present disclosure.

FIG. 5 depicts a schematic diagram of a capacitive galvanic isolation circuit 500 in accordance with some embodiments of the present disclosure. As depicted in FIG. 5, the capacitive galvanic isolation circuit 500 comprises a capacitor bank 502 that may be configured to isolate two tenant cores, one comprising an attacker RO circuit 504 and the other comprising a secure hash algorithm with a 256-bit output (SHA-256 core) 506. A power management unit (PMU) 508 may be configured to select between an isolated power source via CMOS galvanic isolation 516 or CMOS galvanic isolation 518, or a board power source from VCC 512 and VSS 514, and deliver a selected power source to the capacitor bank 502. The capacitor bank 502 may comprise a reconfigurable capacitor bank that, with the power source selected by PMU 508, may isolate and deliver necessary current to connected tenant core regions (e.g., attacker RO circuit 504 and SHA-256 core 506) that is separate or isolated from a board power supply (e.g., VCC 512 and VSS 514). In some embodiments, the capacitor bank 502 comprises one or more charge pump isolation circuits including MoM capacitors.

The PMU 508 is coupled to a configuration controller unit 510 that provides configuration data for managing the power source selecting for causing the isolation and delivery of current to the tenant cores. In some embodiments, the configuration controller unit 510 comprises a custom configuration memory (CCM) that allows FPGA designers to selectively interconnect or isolate groups of CLBs (e.g., comprising tenant cores). In some embodiments, the CCM comprises a dedicated section of a FPGA's memory that is reserved for storing configuration data. The configuration data may define the interconnection or isolation policies for CLBs within a FPGA such that distinct regions may be formed within the FPGA, each capable of sourcing power either from a dedicated CMOS isolation power supply or a standard FPGA voltage power supply. The ability to switch power sources for regions allows for efficient allocation of power resources. For instance, regions with high security demands might be powered by the CMOS isolation source, while less critical regions can use the standard FPGA voltage power supply.

Configuration data stored in the CCM may be loaded during a FPGA's initialization process, defining the isolation policies and power source allocation for each region. The configuration data may accommodate a comprehensive set of policies, including routing information and power source allocation. The size of the configuration data may be in a range from several kilobits to several megabits of configuration memory. Isolation policies can be updated dynamically as operational needs change. In some embodiments, a FPGA can reconfigure the CCM in real-time, allowing it to adapt to evolving isolation requirements and conditions.

Accordingly, the capacitive galvanic isolation circuit 500 provides galvanic isolation among the tenant cores and reduces the chances of undesired DC flow, thereby addressing security issues in multi-tenant cloud FPGA configurations. The capacitive galvanic isolation circuit 500 may also provide defense against potential disturbances, such as voltage fluctuations, ground loops, and electrical noise, which are factors that may otherwise affect the stability and security of the attacker RO circuit 504 and/or the SHA-256 core 506.

Figure 6:
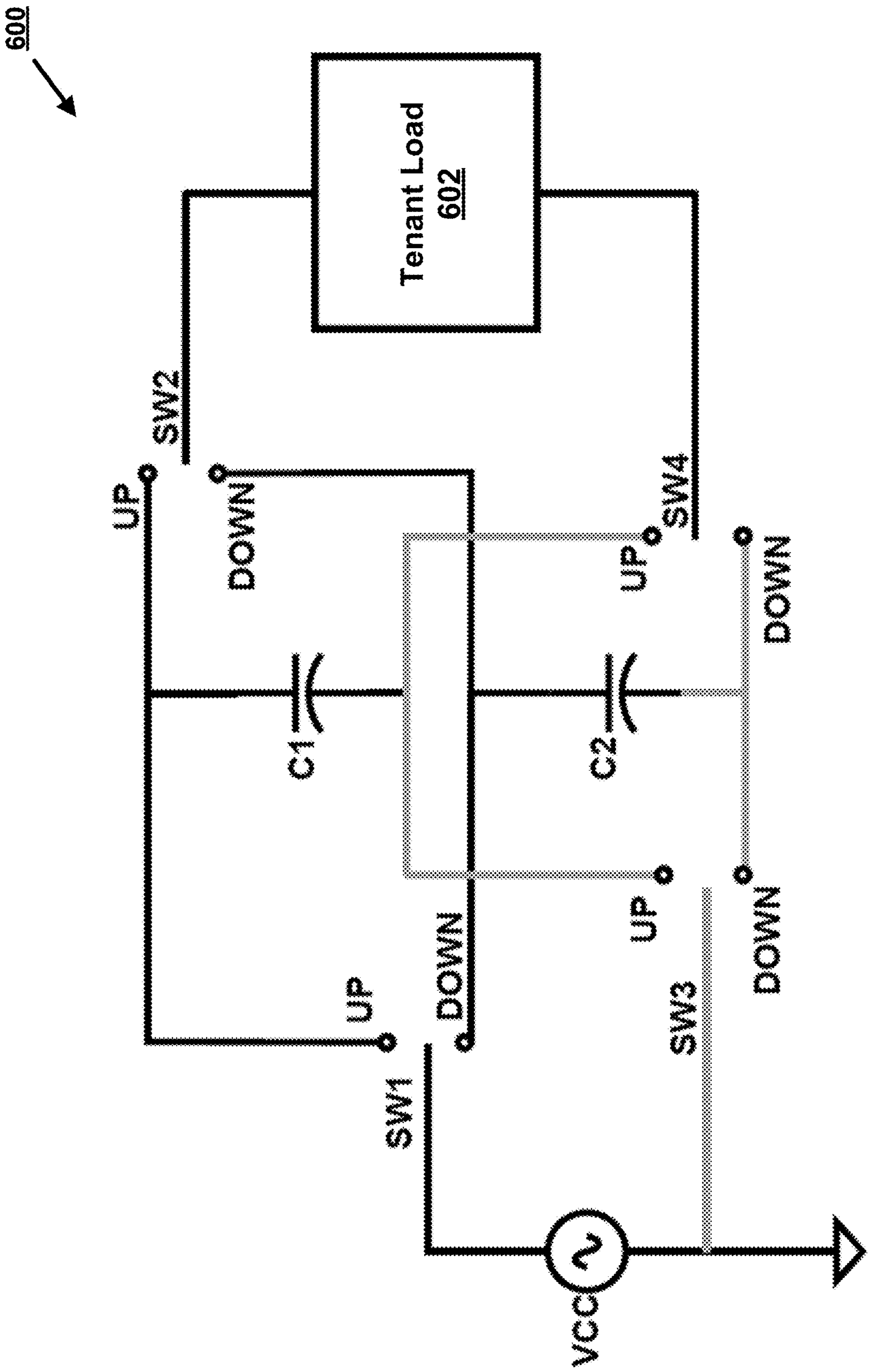
FIG. 6 depicts a schematic diagram of an example charge pump isolation circuit in accordance with some embodiments of the present disclosure.

FIG. 6 depicts a schematic diagram of an example charge pump isolation circuit 600 in accordance with some embodiments of the present disclosure. The charge pump isolation circuit 600 comprises capacitors C1 and C2 for achieving isolation to tenant load 602. The capacitors C1 and C2 are configured in a manner where the capacitor C1 charges, while the capacitor C2 discharges, and vice versa, ensuring seamless switching between two phases. During a first phase, the tenant load 602 circuit connects to capacitor C1 terminals when both switches SW2 and SW4 are in the UP state and both switches SW1 and SW3 are in the DOWN state. The capacitor C1 is configured to discharge (to the tenant load 602) while the capacitor C2 charges during the first phase. Inversely, during a second phase, the tenant load 602 circuit connects to capacitor C2 terminals when both switches SW1 and SW3 are in the UP state and both switches SW2 and SW4 are in the DOWN state. The capacitor C1 is configured to charge while the capacitor C2 discharges (to the tenant load 602) during the first phase.

Example electrical parameters of the charge pump isolation circuit 600 are provided in Table 1. With constant time duration and switching, the tenant load 602 is provided a current with a limit of 22.6 uA. The total capacitance of capacitors C1 and C2 is 1.13 $E^{-10}$ faraday which may be calculated based on the highest allowable current drop in the tenant load 602 (e.g., 22.6 uA). The current drop limit of the provided example may be determined by analyzing the characteristics of an 11-stage attacker RO circuit as a tenant connected in the tenant load 602.

TABLE 1

| Description | Value |
|---|---|
| No. of cycles RO will operate for each phase of circuit | 10 cycles |
| Time period of RO | 50 ns |
| Time for voltage drop | 500 ns |
| Acceptable voltage drop | 100 mV |
| Current consumed by RO | 22.6 uA |
| Charge consumed by RO | $1.13E^{-11}$ Coulomb (Q*t) |
| Capacitance of C1 and C2 | $1.13E^{-10}$ Faraday (C = Q/V) |

Figure 7:
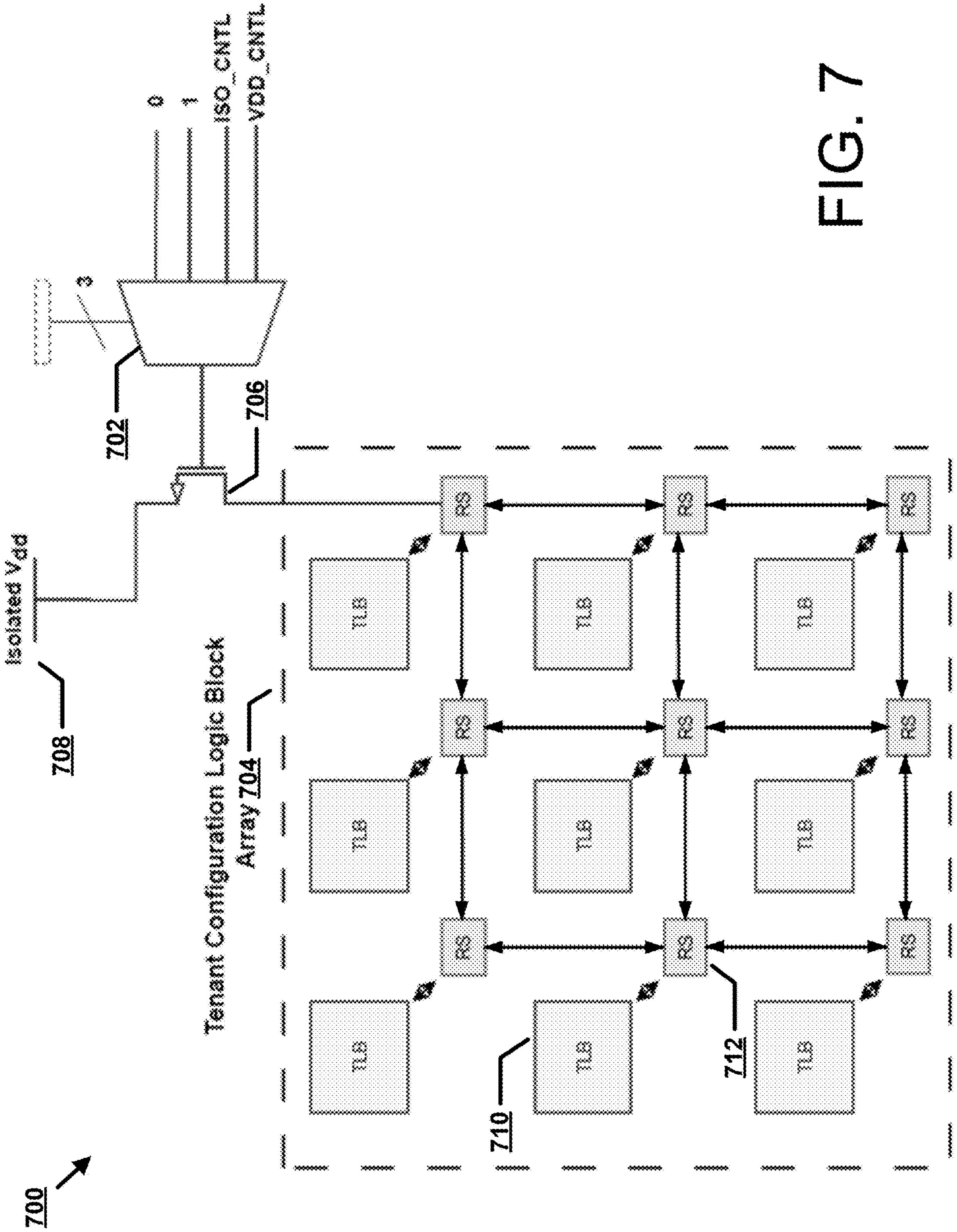
FIG. 7 depicts a schematic diagram of an example isolated tenant logic block architecture in accordance with some embodiments of the present disclosure.

FIG. 7 depicts a schematic diagram of an example isolated tenant logic block architecture 700 in accordance with some embodiments of the present disclosure. The isolated tenant logic block architecture 700 comprises a galvanically isolated Vdd 708 that is provided to a tenant CLB array 704 via a CMOS 706, wherein the CMOS 706 is gated by a multiplexer 702. That is the multiplexer 702 is configured to control operation of the CMOS 706 and selectively provide or modulate a power source to the tenant CLB array 704 between the galvanically isolated Vdd 708 or a board power source that is provided as input to the multiplexer 702.

The tenant CLB array 704 may comprise a programmable routing network including a plurality of Vdd routing switch blocks (SBs) that are configured to provide flexible routing of connections, including control signals for power. As depicted in FIG. 7, the tenant CLB array 704 comprises a tile-based island-style FPGA architecture including one or more tenant logic blocks (TLBs) 710 and one or more Vdd routing switches (RS) 712 that interconnect the one or more TLBs 710. The one or more RS 712 may be configured to receive and route the galvanically isolated Vdd 708 received from the CMOS 706 to a target one of the TLBs 710. In some embodiments, the tenant CLB array 704 may comprise a FPGA device that comprises a two-dimensional array of CLB tiles coupled via a programmable routing network. The isolated tenant logic block architecture 700 may allow for dynamic regulation of power sources for individual tenant logic blocks and routing resources of adjacent routing channels, such as input pin connection boxes and track isolation buffers.

Figure 8:
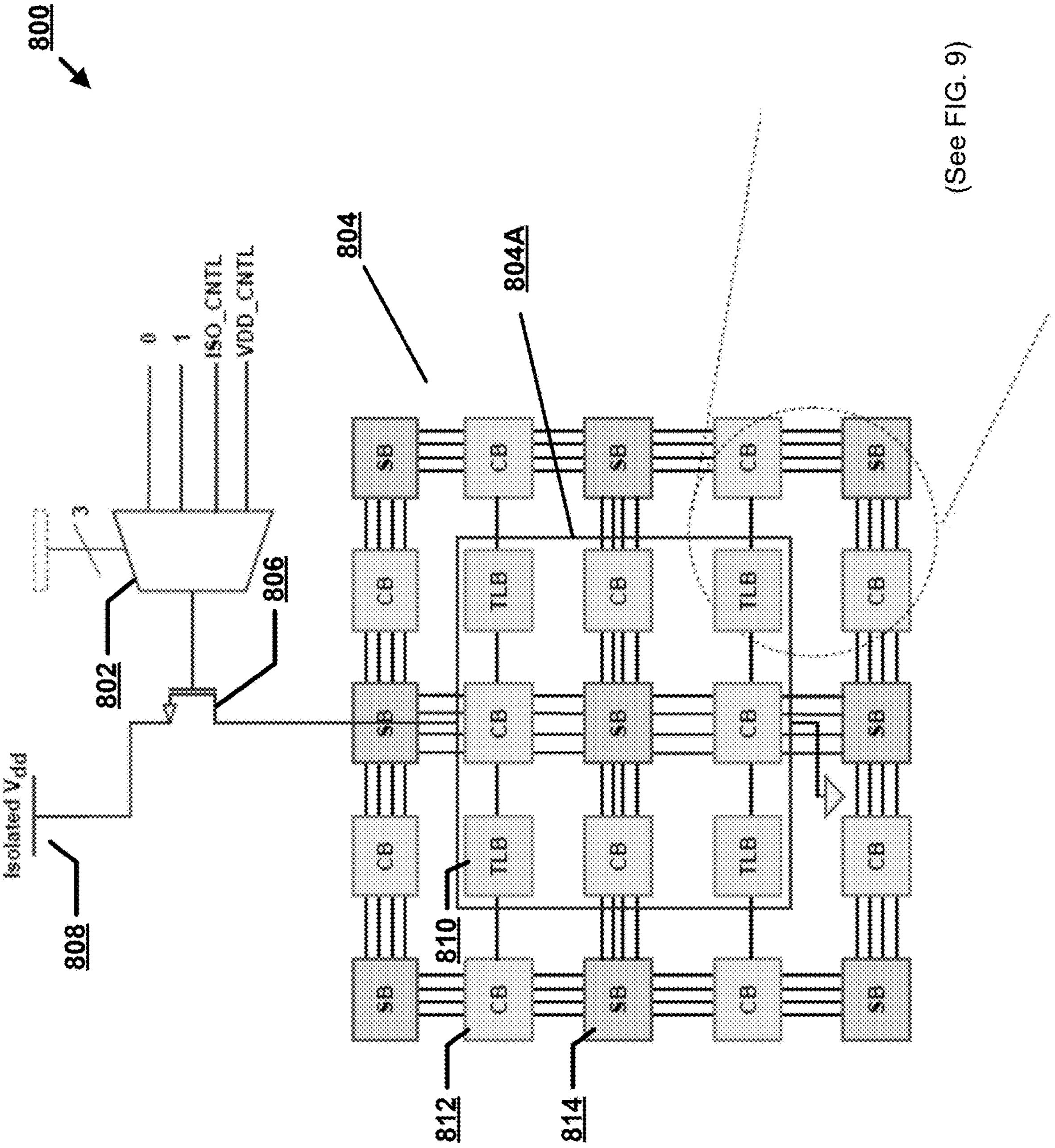
FIG. 8 depicts a schematic diagram of an example isolated tenant logic block architecture in accordance with some embodiments of the present disclosure.

FIG. 8 depicts a schematic diagram of an example isolated tenant logic block architecture 800 in accordance with some embodiments of the present disclosure. The isolated tenant logic block architecture 800 comprises a plurality of tenant logic clusters 804. A tenant logic cluster 804A (of the plurality of tenant logic clusters 804) comprises a plurality of TLBs 810 that are configured in a CLB cluster formation via connection blocks (CBs) 812 and SBs 814. The tenant logic cluster 804A is further coupled to a CMOS 806.

The CMOS 806 is gated via a multiplexer 802 which allows the tenant logic cluster 804A to be provided with either a board power source that is provided as input to the multiplexer 802 or a capacitive isolated Vdd 808. That is, the multiplexer 802 is configured to control a power source that is provided to the tenant logic cluster 804A by switching the CMOS 806 to switch between the board power source or the capacitive isolated Vdd 808. For example, when an isolation signal is positive, the multiplexer 802 may draw voltage from the capacitive isolated Vdd 808 using the ISO_CNTL signal. Alternatively, the multiplexer 802 may drive the CMOS 806 from the board power source by using the VDD_CNTL signal to force the isolation path open. The controlling of multiplexer 802 may be determined by configuration bits generated from a configuration memory (e.g., CCM).

Figure 9:
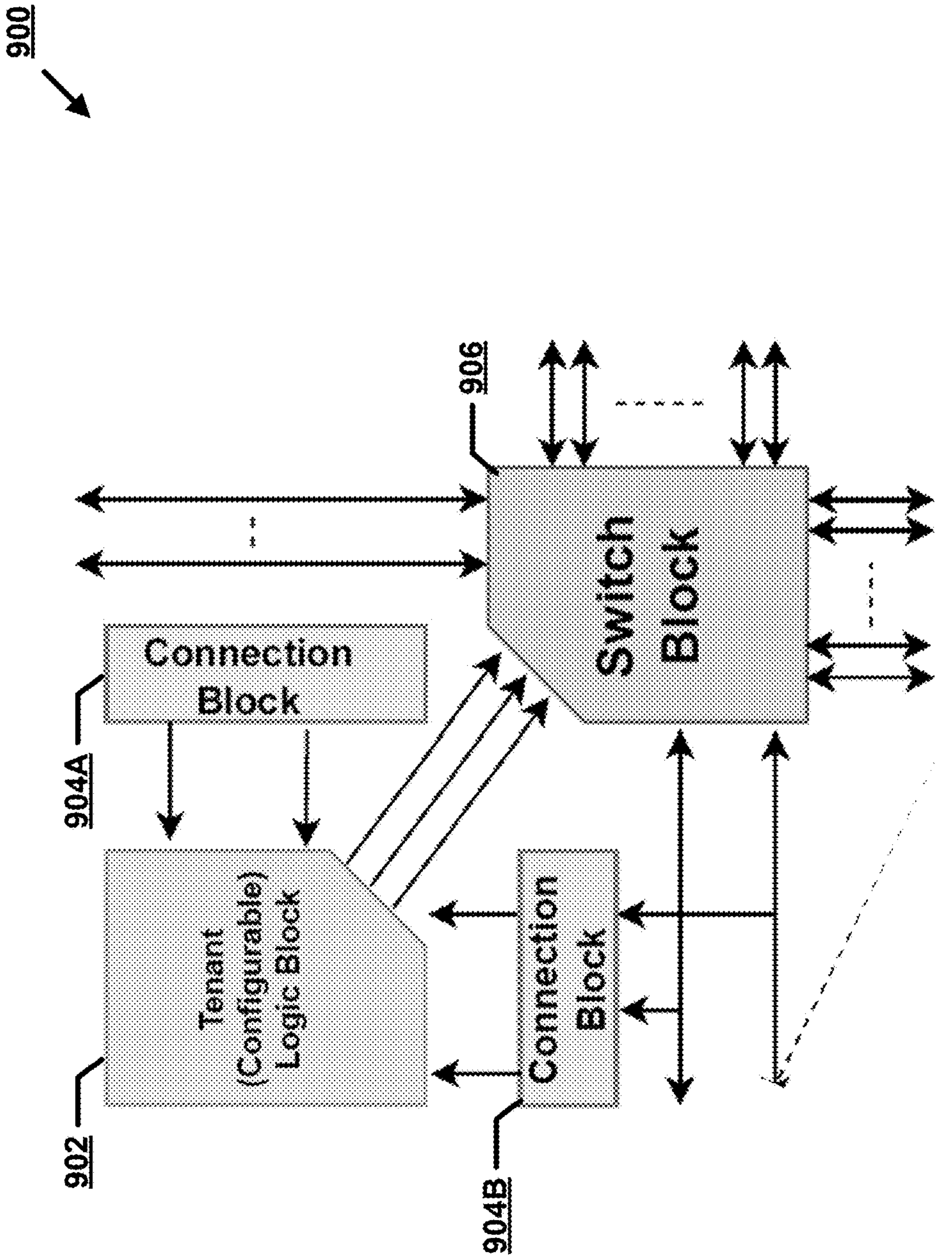
FIG. 9 depicts a schematic diagram of example routing architecture of a tenant logic cluster in accordance with some embodiments of the present disclosure.

FIG. 9 depicts a schematic diagram of example routing architecture of a tenant logic cluster 900 in accordance with some embodiments of the present disclosure. A tenant logic block 902 comprises a plurality of input pins that are accompanied by CBs, for example, symmetrically positioned on four sides, such as 904A and 904B. A CB (e.g., CB 904A or 904B) may be configured to either direct an endpoint of a connection to its corresponding input pin or channel a power control signal to the tenant logic block 902. Output from a CB 904A or 904B may act as input to a multiplexer (e.g., multiplexer 802). The multiplexer may select an input pin that will function as the power source control signal for both the tenant logic block 902 and surrounding routing channels. The SB 906 may be maintained in a powered-on state to facilitate flexible routing of connections, including control signals for power.

Conclusion

It should be understood that the examples and embodiments described herein are for illustrative purposes only and that various modifications or changes in light thereof will be suggested to persons skilled in the art and are to be included within the spirit and purview of this application.

Many modifications and other embodiments of the present disclosure set forth herein will come to mind to one skilled in the art to which the present disclosures pertain having the benefit of the teachings presented in the foregoing descriptions and the associated drawings. Therefore, it is to be understood that the present disclosure is not to be limited to the specific embodiments disclosed and that modifications and other embodiments are intended to be included within the scope of the appended claim concepts. Although specific terms are employed herein, they are used in a generic and descriptive sense only and not for purposes of limitation.

The invention claimed is:

1. A system comprising:
- one or more tenant logic blocks that comprise one or more sharable portions of a field-programmable gate array hardware unit;
- a multiplexed voltage source comprising a multiplexer that is configured to provide the one or more tenant logic blocks with a power source based on one or more control signals, wherein the power source switches between (i) a complementary metal-oxide semiconductor (CMOS) voltage source and ground and (ii) a board voltage source and ground; and
- a configuration memory that is configured to provide the one or more control signals to the multiplexed voltage source.

2. The system of claim 1, wherein the multiplexed voltage source is configured to galvanically isolate the one or more tenant logic blocks via the CMOS voltage source.

3. A galvanic isolation circuit comprising:
- one or more tenant cores;
- a power management unit that is configured to select between an isolated power source or a board power source;
- a capacitor bank that is configured to isolate the one or more tenant cores by delivering one or more currents based on a power source selected by the power management unit; and
- a configuration controller unit that is configured to provide configuration data for managing selection of the power source.

4. The galvanic isolation circuit of claim 3, wherein the capacitor bank comprises a reconfigurable capacitor bank.

5. The galvanic isolation circuit of claim 3, wherein the capacitor bank is configured to galvanically isolate the one or more tenant cores.

6. The galvanic isolation circuit of claim 3, wherein the capacitor bank comprises one or more charge pump isolation circuits that comprise one or more metal-over-metal capacitors.

7. The galvanic isolation circuit of claim 6, wherein a charge pump isolation circuit of the one or more charge pump isolation circuits comprises a tenant load that (i) connects to a first capacitor based on a first set of switches in an up position and a second set of switches in a down position and (ii) connects to a second capacitor based on the second set of switches in the up position and the first set of switches in the down position.

8. The galvanic isolation circuit of claim 7, wherein the first capacitor discharges and the second capacitor charges based on the first set of switches in the up position and the second set of switches in the down position.

9. The galvanic isolation circuit of claim 7, wherein the first capacitor charges and the second capacitor discharges based on the second set of switches in the up position and the first set of switches in the down position.

10. The galvanic isolation circuit of claim 3, wherein the configuration controller unit comprises a configuration memory that is configurable to selectively interconnect or isolate the one or more tenant cores.

11. The galvanic isolation circuit of claim 10, wherein the configuration memory comprises a section of a field-programmable gate array (FPGA) memory that comprises configuration data.

12. The galvanic isolation circuit of claim 11, wherein the configuration data comprises one or more interconnection or isolation policies that are associated with forming distinct regions within a FPGA.

13. An isolated tenant logic block system comprising:
- an isolated power source;
- a complementary metal-oxide semiconductor (CMOS) that is coupled to the isolated power source;
- a plurality of tenant logic blocks that are configured to receive the isolated power source from the CMOS; and
- a multiplexer that is configured to modulate the isolated power source received by the plurality of tenant logic blocks from the CMOS.

14. The isolated tenant logic block system of claim 13, wherein the plurality of tenant logic blocks comprises a field-programmable gate array (FPGA) device that comprises a two-dimensional array of a plurality of configurable logic block tiles that are coupled via a programmable routing network.

15. The isolated tenant logic block system of claim 13, wherein the plurality of tenant logic blocks comprises a programmable routing network, wherein the programmable routing network comprises a plurality of voltage routing switch blocks.

16. The isolated tenant logic block system of claim 13, wherein the plurality of tenant logic blocks comprises a configurable logic block cluster that is coupled to one or more connection blocks and one or more switch blocks.

17. The isolated tenant logic block system of claim 13, wherein the isolated power source comprises a galvanically isolated power source.

18. The isolated tenant logic block system of claim 13, wherein the isolated power source comprises a capacitive isolated power source.

19. The isolated tenant logic block system of claim 13, wherein the multiplexer is configured to provide voltage from the isolated power source based on an isolation control signal.

20. The isolated tenant logic block system of claim 13, wherein the multiplexer is configured to drive the CMOS from a board power source based on a board power source control signal.

* * * * *